United States Patent [19]

Coerver

[11] 4,276,522
[45] Jun. 30, 1981

[54] CIRCULATOR IN A STRIPLINE MICROWAVE TRANSMISSION LINE CIRCUIT

[75] Inventor: Leo E. Coerver, Dallas, Tex.

[73] Assignee: General Dynamics, Pomona, Calif.

[21] Appl. No.: 104,523

[22] Filed: Dec. 17, 1979

[51] Int. Cl.³ .......................................... H01P 1/387
[52] U.S. Cl. ..................................... 333/1.1; 333/246
[58] Field of Search ............................... 333/1.1, 24.2

[56] References Cited

U.S. PATENT DOCUMENTS

| | | | |
|---|---|---|---|
| 3,334,317 | 8/1967 | Andre | 333/1.1 |
| 3,355,679 | 11/1967 | Carr | 333/1.1 |
| 3,414,843 | 12/1968 | Jansen | 333/1.1 |
| 3,551,853 | 12/1970 | Konishi | 333/1.1 |
| 3,614,675 | 10/1971 | Konishi | 333/1.1 X |
| 3,651,434 | 3/1972 | McGeough et al. | |
| 3,739,302 | 6/1973 | McManus | 333/1.1 |

OTHER PUBLICATIONS

Lax et al., *Microwave Ferrites and Ferrimagnetics,* McGraw-Hill, N.Y., 1962, pp. 621, 622.

*Primary Examiner*—Paul L. Gensler
*Attorney, Agent, or Firm*—Neil F. Martin; Edward W. Callan; Edward B. Johnson

[57] ABSTRACT

A circulator in a stripline microwave transmission line circuit that is disposed in a pattern of printed circuit conductors between a pair of facing dielectric material circuit boards having conductive ground planes on their exposed broad faces. The circulator includes three printed circuit center conductors disposed between the two boards in a symmetrical array extending radially from a circular hole aligned through the two boards; a conductive foil having a central portion concentrically disposed within the perimeter of the hole and three radially projecting arms arranged in contact with the radially extending center conductors; a pair of pucks of ferrite material of a predetermined size selected to provide circulation of microwave signals of a predetermined wavelength concentrically disposed in the hole on opposite sides of the conductive foil; a pair of conductive covers in contact with the ground plane conductors and extending to completely enclose the ferrite pucks within the hole; a pair of magnets disposed on opposite sides of the boards in axial alignment with the ferrite pucks for providing a magnetic field through and normal to the central portion of the conductive foil; magnetically permeable material contacting the magnet and concentrically disposed for providing a closed magnetic loop for shielding the circulator; and a pair of high dielectric material rings disposed in the holes for radially enclosing the pucks and making contact with both the pucks and the surfaces of the board defining the holes, wherein the radial thickness of each ring is one-quarter of the predetermined wavelength for impedance matching the circulator to each of the transmission lines defined by the center conductors and the ground planes. The conductive covers are dished to have respective central portions that are recessed below the ground planes to broadly contact the ferrite pucks and maintain the ferrite pucks in contact with the conductive foil.

9 Claims, 3 Drawing Figures

CIRCULATOR IN A STRIPLINE MICROWAVE TRANSMISSION LINE CIRCUIT

BACKGROUND OF THE INVENTION

The present invention pertains to an improvement in a circulator for a stripline microwave transmission line circuit.

A circulator is a microwave coupling device having three or more terminals, and is so constructed that energy entering one terminal is transmitted to the next adjacent terminal in a particular direction. Although circulators have been used for many years their principal application has been in coupling microwave energy transmitted in waveguides. Recently there has been a demand for circulators for coupling microwave energy transmitted in stripline devices, thereby necessitating a drastic reduction in the size and weight of the circulator.

One circulator that was designed for use in a stripline configuration is described in U.S. Pat. No. 3,334,317 to Andre. As described therein, the stripline microwave transmission line circuit is disposed in a pattern of printed circuit conductors between a pair of facing dielectric material circuit boards having conductive ground planes on their exposed broad faces. The circulator includes three printed circuit center conductors disposed between the two boards in a symmetrical array extending radially from a circular hole aligned through the two boards, wherein the center conductors and the ground planes define transmission lines terminating in ports at the circular hole; a conductive foil having a central portion concentrically disposed within the perimeter of the hole and three radially projecting arms arranged in contact with the radially extending center conductors for electrically connecting the center conductors together to provide signal paths between adjacent ports; a pair of pucks of ferrite material of a predetermined size selected to provide circulation of microwave signals of a predetermined wavelength concentrically disposed in the hole on opposite sides of the conductive foil; a pair of conductive covers in contact with the ground plane conductors to provide an rf ground for the ferrite pucks, and extending to completely enclose the ferrite pucks within the hole; a pair of magnets disposed on opposite sides of the boards in axial alignment with the ferrite pucks for providing a magnetic field through and normal to the central portion of the conductive foil to thereby enable a microwave signal to be circulated from a transmission line port defined by one center conductor and its respective ground planes to a port defined by an adjacent center conductor and its ground planes, in a direction determined by the direction of the magnetic field; and magnetically permeable material contacting the magnets and concentrically disposed for providing a closed magnetic loop for shielding the circulator.

Magnetic shielding of the circulator is quite important. Because circulators include one or two disc magnets to provide magnetic bias, if no magnetically permeable means for directing the return path is included, the return path for the magnetic field is through the surrounding region. If there is a magnetic material such as Kovar near an exposed magnet face, or a second unshielded circulator nearby, the presence of the ferromagnetic material or the second circulator will change the field in and de-tune the first circulator.

At the same time as circulators were being made smaller, signal sources for microwave transmission systems were growing more complex. In some pulsed coherent sources, a number of Y-junction circulators are needed. Proliferation of Y-junction circulators in a single subsystem means a larger fraction of the system's weight and volume is devoted to the circulators. Thus, a small light-weight circulator which can be made an integral part of a stripline circuit is now almost mandatory.

Also, consideration must be given to the fact that as the components of the circulator become smaller their relative dimensions become much more critical in view of the microwave frequencies at which the circulators are used. In this regard it is particularly important to provide a circulator which can readily be impedance-matched to the transmission lines defined by the center conductors at the predetermined frequency (or wavelength) of operation for which the system is designed.

SUMMARY OF THE INVENTION

The present invention is an improved circulator for a stripline microwave transmission line circuit. The present invention provides a circulator which may readily be impedance-matched to transmission lines; which has a small compact configuration enabling it to be an integral part of the stripline circuit; and which has a magnetic return path design that enhances magnetic shielding of the circulator.

The circulator of the present invention incorporates the general features of the circulator described in U.S. Pat. No. 3,334,317 referred to hereinabove, except that there may be more than three printed circuit center conductors symmetrically arrayed between the two boards, and there may be either one or two magnets disposed in axial alignment with the ferrite pucks for providing the magnetic field. The magnetic circuit is simpler in construction and the conductive covers not only provide rf grounds on the outer sides of the ferrite pucks and dielectric rings, but are thick enough to support the puck-ring combination; they are recessed on their outer sides to center and locate the disc magnets; and they form part of rigid holes in the circuit board for the magnetic return path legs.

Preferably, the circulator of the present invention includes a pair of high dielectric material rings disposed in the hole for radially enclosing the pucks and making contact with both the pucks and the surfaces of the boards defining the hole, wherein the radial thickness of each ring is one-quarter the predetermined wavelength for impedance matching the circulator to the impedance of the transmission line defined by each center conductor and its adjacent ground planes. The radial thickness is the difference between the inside radius and the outside radius of the ring. Also critical to impedance matching is the width of the radially projecting arms of the conductive foil where they contact the center conductors inasmuch as the circulator impedance varies with the width of the center conductors feeding it. However, the design parameter of arm width is relatively easy to customize for a particular system, whereas the ring dimensions cannot easily be changed. Thus, in essence the provision of the ring having a one-quarter wavelength radial thickness results in a practical circulator which can readily be impedance matched to various transmission lines.

To provide a more compact circulator, the conductive covers are dished to have respective central portions that are recessed below the ground plane to broadly contact the ferrite pucks and maintain the ferrite pucks in contact with the conductive foil. Thus the effective air gap between the magnets is made smaller and smaller magnets can be used. In a preferred embodiment wherein a pair of magnets are axially aligned with the ferrite pucks on opposite sides of the board, for providing the magnetic field, the magnets are disposed in the recesses of the conductive covers, are aligned by the recesses in the covers and are in contact with the conductive covers and the magnetically permeable material.

Preferably, the central portion of the conductive foil is circular and has the same diameter as each of the ferrite pucks, and the magnets are matching solid right cylinders having diameters that are greater than the diameters of the ferrite pucks for enhancing the uniformity of the magnetic field normal to the central portion of the conductive foil. This embodiment is further characterized by the rings being of the same height as the pucks that they radially enclose, whereby the conductive covers compactly enclose the contents of the hole. This is important in this device since the thickness of the puck and ring combination is considerably thinner than the surrounding dielectric material. Such compact enclosure enhances the efficiency and uniformity of operation of the circulator by decreasing the effective air gap for the magnets, allowing the ferrites to be biased with thinner disc magnets. Magnetic shielding is enhanced in the circulator of the present invention by the boards symmetrically defining slots between the center conductors and adjacent the hole; and the magnetically permeable material including a disk concentrically contacting one magnet, and a symmetrical stool concentrically contacting the other magnet and having a number of legs corresponding to the number of center conductors extending through the slots and concentrically contacting the disk for closely shielding the circulator. Preferably, the slots and the legs of the stool have approximately the same dimension where the legs extend through the slots, and are substantially wider concentrically than radially.

DESCRIPTION OF THE PREFERRED EMBODIMENT

Figure 1:
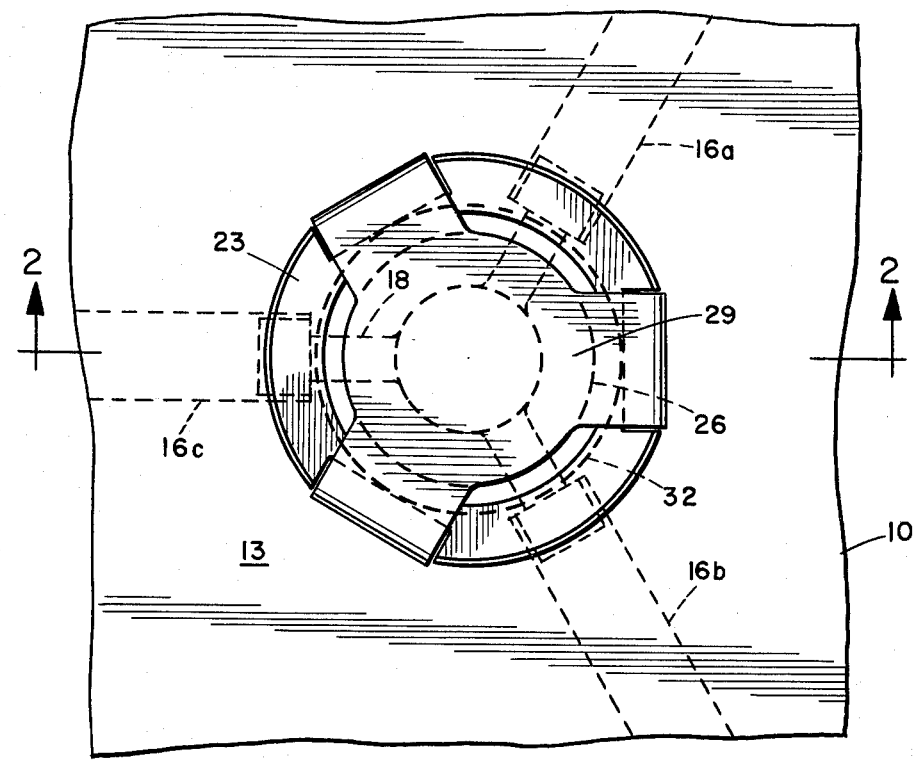
FIG. 1 is a top plan view of a circulator according to the present invention.
Figure 2:
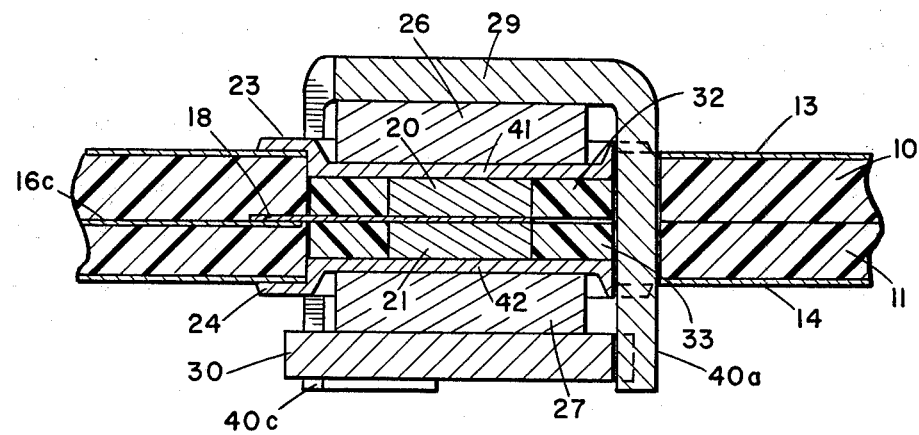
FIG. 2 is a sectional view taken along line 2—2 of FIG. 1.
Figure 3:
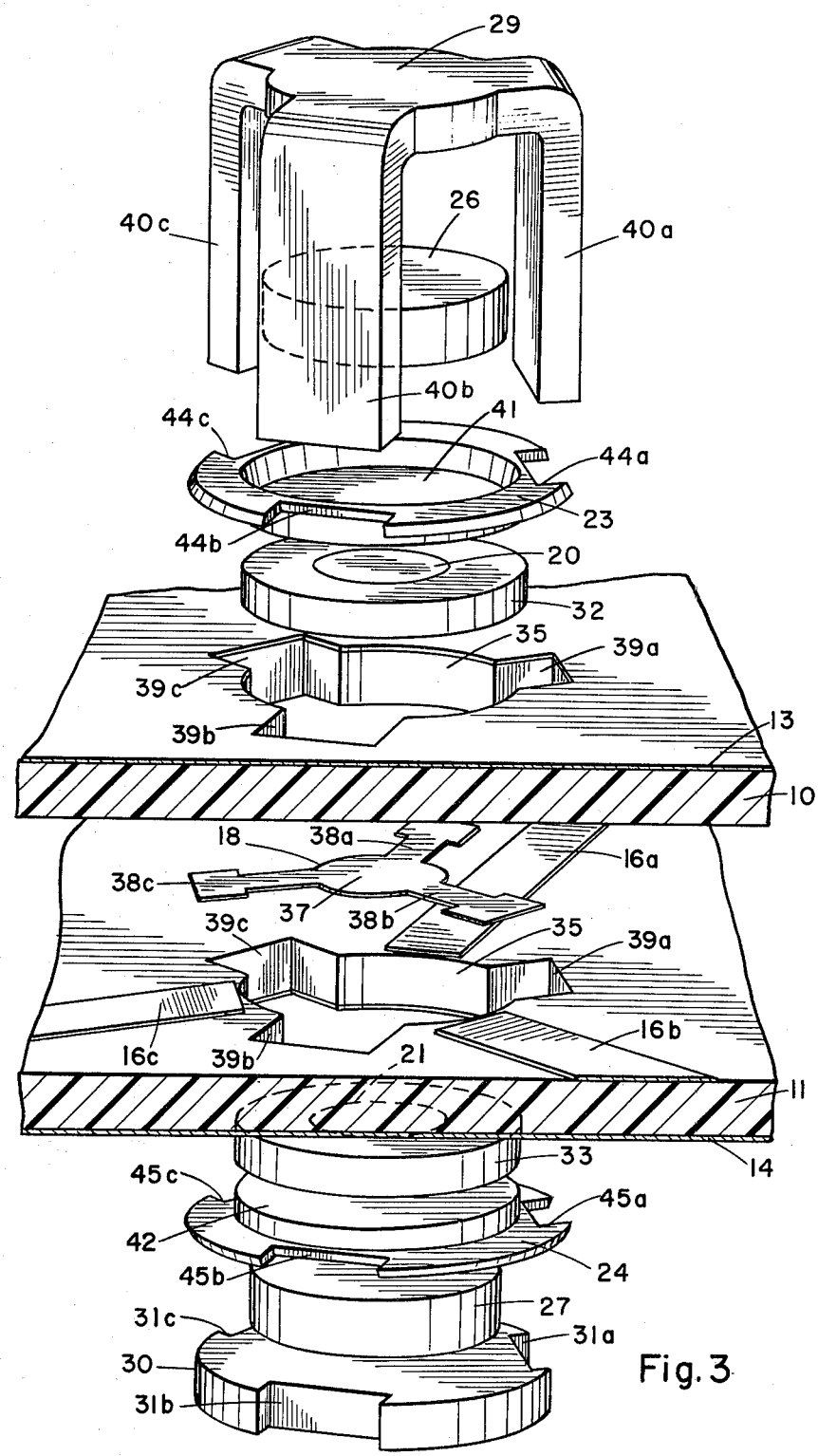
FIG. 3 is an exploded perspective view of the circulator shown in FIGS. 1 and 2.

Referring to FIGS. 1, 2 and 3, a preferred embodiment of a Y-junction circulator according to the present invention is contained as an integral part of a stripline microwave transmission line circuit which is disposed in a pattern of printed circuit conductors between a pair of facing dielectric material circuit boards 10 and 11 having conductive ground planes 13, 14 on their exposed broad faces.

The circulator includes three printed circuit center conductors 16a, 16b, 16c; a conductive foil 18; a pair of ferrite pucks 20, 21; a magnetically permeable stool 29; a magnetically permeable disk 30; and a pair of high dielectric constant material rings 32, 33. A circular hole 35 is aligned through the two boards 10, 11.

The three printed circuit center conductors 16a, 16b, 16c are disposed on the board 11 between the two boards 10, 11 in a symmetrical array extending radially from the circular hole 35. The center conductors 16a, 16b, 16c and the ground planes 13, 14 define transmission lines terminating in ports at the circular hole 35.

The conductive foil 18 has a central portion 37 concentrically disposed within the perimeter of the hole 35 and three radially projecting arms 38a, 38b, 38c, arranged in contact with the radially extending center conductors 16a, 16b, 16c, respectively for electrically connecting the center conductors together, and in conjunction with the dielectric rings 32, 33 and the conducting covers 23, 23, provides signal paths between adjacent ports defined by the center conductors 16a, 16b, 16c.

The pair of pucks 20, 21 of ferrite material are of a predetermined size that is selected to provide circulation of microwave signals of a predetermined wavelength. The pucks 20, 21 are concentrically disposed in the hole 35 on opposite sides of the conductive foil 18.

The pair of conductive covers 23, 24, when soldered to the ground planes 13, 14, provide an rf ground on either side of the ferrite puck pair and also provide a method of centering the magnets 26, 27 over the ferrite pucks 20, 21; and these covers extend to completely enclose the pucks 20, 21 within the hole 35.

The pair of magnets 26, 27 are disposed in axial alignment with the ferrite pucks 20, 21 on opposite sides of the boards 10, 11 by means of the recesses in the conductive covers 23, 24 and provide a magnetic field through and normal to the central portion 37 of the conductive foil 18 to thereby enable a microwave signal to be circulated from a port defined by one of the center conductors 16a, 16b, 16c to an adjacent port defined by one of the center conductors and the common ground planes defined by the conductive covers 23, 24 in a direction determined by the direction of the magnetic field.

The boards 10, 11 symmetrically define slots 39a, 39b, 39c between the center conductors 16a, 16b, 16c and adjacent the hole 35.

The magnetically permeable material disk 30 concentrically contacts the magnet 27 magnetically. The magnetically permeable material stool 29 is symmetrical, and concentrically contacts the other magnet 26 magnetically. The stool 29 has three legs 40a, 40b, 40c extending through the slots 39a, 39b, 39c respectively, and concentrically contacts the disk 30 for providing a symmetrical closed magnetic loop for closely shielding the circulator and providing a short, low reluctance return path. The disk 30 defines slots 31a, 31b, and 31c for engaging the legs 40a, 40b, 40c of the stool 29.

The pair of high dielectric constant material rings 32, 33 are disposed in the hole 35 for radially enclosing the pucks 20, 21 and make contact with both the pucks 20, 21 and the surfaces of the boards 10, 11 defining the hole 35. The radial thickness of each ring 32, 33 is one-quarter the predetermined wavelength for impedance matching the circulator to each of the transmission lines defined by the center conductors 16a, 16b, 16c and the common ground planes 13, 14.

The central portion 37 of the conductive foil 18 is circular and has the same diameter as each of the ferrite pucks 20, 21. The magnets 26, 27 are matching solid right cylinders having diameters that are greater than the diameters of the ferrite pucks 20, 21 for enhancing the uniformity of the magnetic field normal to the central portion of the conductive foil 18. The rings 32, 33 are the same height as the pucks 20, 21 that they radially enclose whereby the conductive covers 23, 24 provide a uniform rf ground for the circulator and matching sections of the circulator and compactly enclose the contents of the hole 35.

The conductive covers 23, 24 are dished to have respective central portions 41, 42 that are recessed below the ground planes 13, 14 to broadly contact the ferrite pucks 20, 21 and provide an rf ground for the ferrite pucks which are of reduced thickness compared with the circuit boards, and maintain the ferrite pucks in contact with the conductive foil 18. The magnets 26, 27 are disposed in the recesses of the conductive covers 23, 24 and in contact with the central portions 41, 42 of the conductive covers. The conductive covers 23, 24 also contain slots 44a, 44b, 44c and 45a, 45b, 45c respectively that are aligned for enabling the legs 40a, 40b, 40c to pass therethrough.

The slots 39a, 39b, 39c through the boards 10, 11 and the legs 40a, 40b, 40c of the stool 29 have approximately the same dimensions where the legs extend through these slots, and are substantially wider concentrically than radially.

Preferably, the ferrite pucks 20, 21 are made of yittrium iron garnet (YIG); the conductive covers 23, 24 and the conductive foil 18 are made of a non-magnetic material such as beryllium copper; the rings 32, 33 are made of high dielectric constant magnesium titanate (a mixture of $M_gO$ and $Ti_2O_3$); the magnets 26, 27 are made of $SaCo_5$; and the stool 29 and dish 30 are made of Mu-metal, which is a special alloy that is approximately 75% Ni, 5% Cu and 20% Fe.

To convert the circulator of the present invention to an isolator, one of the central conductors 16a, 16b, 16c is terminated in the characteristic-impedance of the transmission lines of which 16a, 16b and 16c are the center conductors.

Having described my invention, I now claim:

1. In a stripline microwave transmission line circuit disposed in a pattern of printed circuit conductors between a pair of facing dielectric material circuit boards having conductive ground planes on their exposed broad faces, a circulator comprising at least three printed circuit center conductors disposed between the two boards in a symmetrical array extending radially from a circular hole aligned through the two boards, wherein the center conductors and the ground planes define transmission lines terminating in ports at the circular hole;

a conductive foil having a central portion concentrically disposed within the perimeter of the hole and radially projecting arms arranged in contact with the radially extending center conductors for electrically connecting the center conductors together to form signal paths between adjacent ports;

a pair of pucks of ferrite material of a predetermined size selected to provide circulation of microwave signals of a predetermined wavelength concentrically disposed in the hole on opposite sides of the conductive foil;

a pair of conductive covers in contact with the ground plane conductors to provide an rf ground for the ferrite pucks, and extending to completely enclose the ferrite pucks within the hole;

a magnet disposed in axial alignment with the ferrite pucks for providing a magnetic field through and normal to the central portion of the conductive foil to thereby enable a microwave signal to be circulated from a port defined by one of the center conductors to a port defined by an adjacent one of the center conductors in a direction determined by the direction of said magnetic field; and magnetically permeable material contacting the magnet and concentrically disposed for providing a closed magnetic loop for shielding the circulator; and a pair of high dielectric material rings disposed in the hole for radially enclosing the pucks and making contact with both the pucks and the surfaces of the boards defining the hole, wherein the radial thickness of each ring is one-quarter said predetermined wavelength for impedance matching the circulator to each of the transmission lines defined by the center conductors and the ground planes, wherein the improvement comprises the conductive covers being dished to have respective central portions that are recessed below the ground planes to broadly contact the ferrite pucks and maintain the ferrite pucks in contact with the conductive foil.

2. A circulator according to claim 1, wherein a pair of said magnets are axially aligned with the ferrite pucks on opposite sides of the boards for providing said magnetic field, characterized by the magnets being disposed in the recesses of the conductive covers and in contact with the conductive covers and the magnetically permeable material.

3. A circulator according to claim 2, characterized by the boards symmetrically defining slots between the center conductors and adjacent the hole; and the magnetically permeable material including a disk concentrically contacting one magnet, and a symmetrical stool concentrically contacting the other magnet and having a number of legs corresponding to the number of center conductors extending through the slots and concentrically contacting the disk for closely magnetically shielding the circulator.

4. A circulator according to claim 2, wherein the central portion of the conductive foil is circular and has the same diameter as each of the ferrite pucks, and the magnets are matching solid right cylinders having diameters that are greater than the diameters of the ferrite pucks for enhancing the uniformity of the magnetic field normal to the central portion of the conductive foil;

characterized by the rings being of the same height as the pucks that they radially enclose, whereby the conductive covers compactly enclose the contents of the hole.

5. A circulator according to claim 4, characterized by the boards symmetrically defining slots between the center conductors and adjacent the hole; and the magnetically permeable material including a disk concentrically contacting one magnet, and having a number of legs corresponding to the number of center conductors extending through the slots and concentrically contacting the disk for closely magnetically shielding the circulator.

6. In a stripline microwave transmission line circuit disposed in a pattern of printed circuit conductors between a pair of facing dielectric material circuit boards having conductive ground planes on their exposed broad faces, a circulator comprising at least three printed circuit center conductors disposed between the two boards in a symmetrical array extending radially from a circular hole aligned through the two boards, wherein the center conductors and the ground planes define transmission lines terminating at ports in the circular hole;

a conductive foil having a central portion concentrically disposed within the perimeter of the hole and radially projecting arms arranged in contact with the radially extending center conductors for electrically connecting the center conductors together to form signal paths between adjacent ports;

a pair of pucks of ferrite material of a predetermined size selected to provide circulation of microwave signals of a predetermined wavelength concentrically disposed in the hole on opposite sides of the conductive foil;

a pair of conductive covers in contact with the ground plane conductors to provide an rf ground for the ferrite pucks, and extending to completely enclose the ferrite pucks within the hole;

a magnet disposed in axial alignment with the ferrite pucks for providing a magnetic field through and normal to the central portion of the conductive foil to thereby enable a microwave signal to be circulated from a port defined by one of the center conductors to a port defined by an adjacent one of the center conductors in a direction determined by the direction of said magnetic field; and magnetically permeable material contacting the magnet and concentrically disposed for providing a closed magnetic loop for shielding the circulator;

wherein the improvement comprises the conductive covers being dished to have respective central portions that are recessed below the ground planes to broadly contact the ferrite pucks and maintain the ferrite pucks in contact with the conductive foil.

7. A circulator according to claim 6, wherein a pair of said magnets are axially aligned with the ferrite pucks on opposite sides thereof for providing said magnetic field, characterized by the magnets being disposed in the recesses of the conductive covers and in contact with the conductive covers and the magnetically permeable material.

8. In a stripline microwave transmission line circuit disposed in a pattern of printed circuit conductors between a pair of facing dielectric material circuit boards having conductive ground planes on their exposed broad faces, a circulator comprising at least three printed circuit center conductors disposed between the two boards in a symmetrical array extending radially from a circular hole aligned through the two boards, wherein the center conductors and the ground planes define transmission lines terminating in ports at the circular hole;

a conductive foil having a central portion concentrically disposed within the perimeter of the hole and radially projecting arms arranged in contact with the radially extending center conductors for electrically connecting the center conductors together;

a pair of pucks of ferrite material of a predetermined size selected to provide circulation of microwave signals of a predetermined wavelength concentrically disposed in the hole on opposite sides of the conductive foil;

a pair of conductive covers in contact with the ground plane conductors to provide an rf ground for the ferrite pucks, and extending to completely enclose the ferrite pucks within the hole;

a pair of magnets disposed in axial alignment with the ferrite pucks on opposite sides of the board for providing a magnetic field through and normal to the central portion of the conductive foil to thereby enable a microwave signal to be circulated from a port defined by one of the center conductors to a port defined by an adjacent one of the center conductors in a direction determined by the direction of said magnetic field; and magnetically permeable material contacting the magnets and concentrically disposed for providing a closed magnetic loop for shielding the circulator;

wherein the improvement comprises the boards symmetrically defining slots between the center conductors and adjacent the hole; and the magnetically permeable material including a disk concentrically contacting one magnet, and a symmetrical stool concentrically contacting the other magnet and having a number of legs corresponding to the number of center conductors extending through the slots and concentrically contacting the disk for closely magnetically shielding the circulator.

9. A circulator according to claim 8, wherein the slots and the legs of the stool have approximately the same dimension where the legs extend through the slots and are substantially wider concentrically than radially.

* * * * *